(12) United States Patent
Dai et al.

(10) Patent No.: US 7,990,107 B2
(45) Date of Patent: Aug. 2, 2011

(54) ELECTRONIC DEVICE AND CHARGING CONTROL CIRCUIT

(75) Inventors: Lung Dai, Taipei Hsien (TW); Qiao-Lin Deng, Shenzhen (CN); Yong-Song Shi, Shenzhen (CN); Wang-Chang Duan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 615 days.

(21) Appl. No.: 12/173,003

(22) Filed: Jul. 14, 2008

(65) Prior Publication Data

US 2009/0167250 A1    Jul. 2, 2009

(30) Foreign Application Priority Data

Dec. 28, 2007  (CN) .......................... 2007 1 0203536

(51) Int. Cl.
*H02J 7/00* (2006.01)
*H02J 7/04* (2006.01)

(52) U.S. Cl. ......... 320/128; 320/137; 320/166; 320/167
(58) Field of Classification Search ................. 320/128
See application file for complete search history.

(56) References Cited

U.S. PATENT DOCUMENTS 6,937,947 B2    8/2005  Trembley
6,975,216 B2 *  12/2005 Tharman et al. ............. 340/438

FOREIGN PATENT DOCUMENTS

CN    1160312 A    9/1997
CN    2602410 Y    2/2004

* cited by examiner

*Primary Examiner* — Edward Tso
*Assistant Examiner* — Ahmed Omar
(74) *Attorney, Agent, or Firm* — Frank R. Niranjan

(57) ABSTRACT

An exemplary charging control circuit includes a signal shaping unit, a first switch unit, and a second switch unit. The signal shaping unit receives a control signal, and is capable of reshaping the received control signal to have a time interval transited from a first state to a second state. The first switch unit receives the shaped control signal, and generates a first switching signal. The second switch unit receives the first switching signal, and is capable of being turned on based on the first switching signal for allowing electrical power to be outputted to a battery.

18 Claims, 3 Drawing Sheets

US 7,990,107 B2

ELECTRONIC DEVICE AND CHARGING CONTROL CIRCUIT

BACKGROUND

1. Field of the Invention

The present invention relates to electronic devices, and particularly to an electronic device having a battery charging control circuit.

2. Description of Related Art

Portable electronic devices, such as cellular phones and portable computers are powered by direct current (DC). When the power source available is an alternating current (AC) source, adapters are used to convert the AC to DC. The DC source may be rechargeable batteries that are housed in the casing of the portable electronic device. For charging the rechargeable batteries, the portable electronic device generally includes a microcontroller and a charging control circuit controlled by the microcontroller. When the charging function is enabled, the microcontroller sends a control signal to the charging control circuit. The charging control circuit electrically connects an external power source to a battery based on the control signal, such that the battery can be charged.

However, when the charging control circuit is electrically connected to the external power source, an instantaneous current may be generated, which may destroy some electrical elements, such as transistors deployed in the charging control circuit.

Therefore, providing a charging control circuit capable of protecting the electrical elements therein from being destroyed by the instantaneous current is desired. Moreover, providing an electronic device employing the charging control circuit is desired.

SUMMARY

Accordingly, a charging control circuit capable of protecting electrical elements deployed therein is provided. The charging control circuit includes a signal shaping unit, a first switch unit, and a second switch unit. The signal shaping unit receives a control signal, and is capable of reshaping the received control signal to have a time interval transited from a first state to a second state. The first switch unit receives the shaped control signal, and generates a first switching signal. The second switch unit receives the first switching signal, and is capable of being turned on based on the first switching signal for allowing electrical power to be outputted to a battery.

Other advantages and novel features will become more apparent from the following detailed description of exemplary embodiment when taken in conjunction with the accompanying drawings.

DETAILED DESCRIPTION

Figure 1:
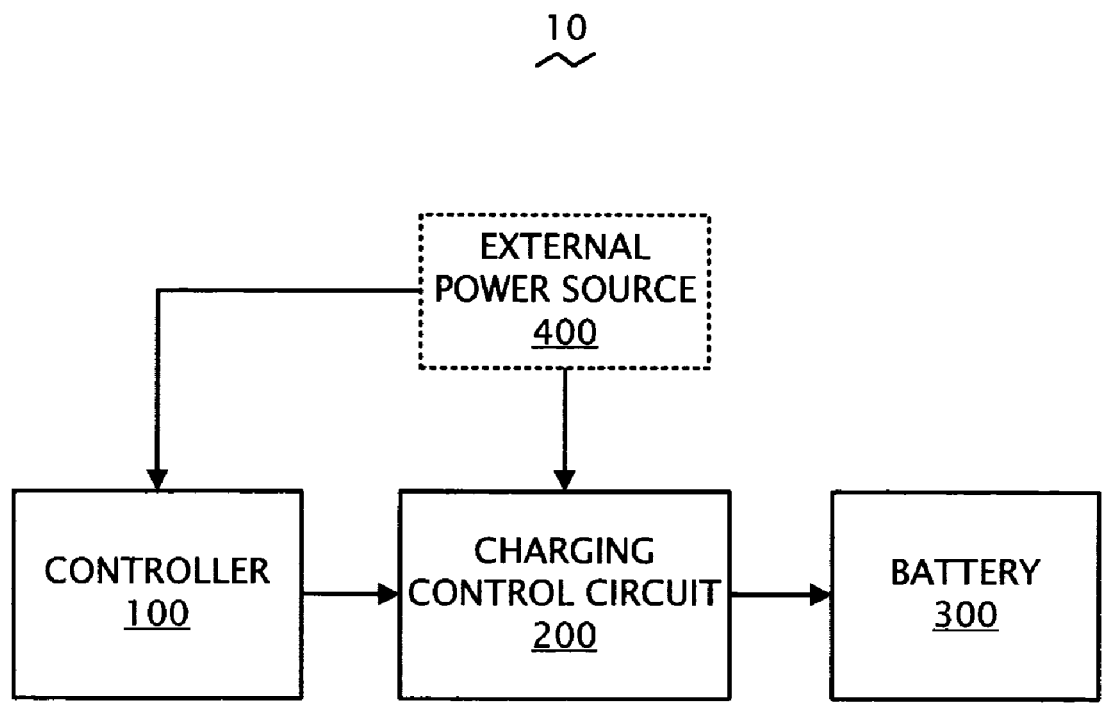
FIG. 1 is a functional block diagram of an electronic device employing a charging control circuit according to an exemplary embodiment.

Referring to FIG. 1, a functional block diagram of an electronic device 10 in accordance with an exemplary embodiment is illustrated. The electronic device 10 may be a cellular phone or a portable computer. The electronic device 10 generally includes a controller 100, a charging control circuit 200, and a battery 300. The charging control circuit 200 is electrically coupled between the controller 100 and the battery 300. The charging control circuit 200 is configured for charging the battery 300 based on a control signal transmitted from the controller 100.

The controller 100 is configured for transmitting the control signal to the charging control circuit 200 when the electronic device 10 is enabled to actuate a charging function. The electronic device 10 may be enabled by plugging a power adapter (not shown) associated with the electronic device 10 into an external power source 400 (e.g., 220/110 volts AC), as such, the control signal is generated correspondingly. The charging control circuit 200 receives electrical power supplied from the external power source 400, and provides the electrical power to the battery 300 in response to the control signal.

Figure 2:
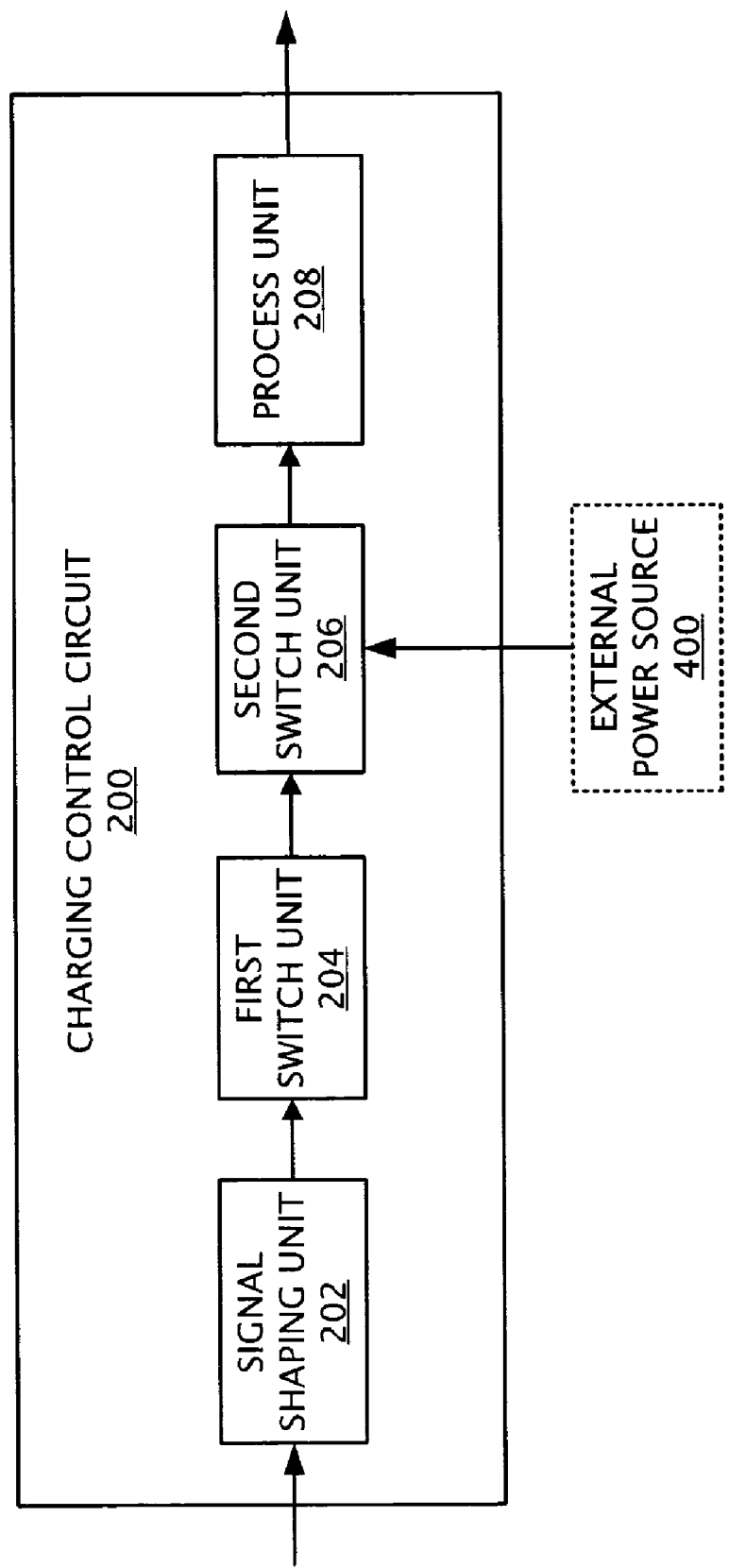
FIG. 2 is a functional block diagram of the charging control circuit in FIG. 1.

Referring to FIG. 2, a detailed block diagram of the charging control circuit 200 in accordance with an exemplary embodiment is illustrated. The charging control circuit 200 includes a signal shaping unit 202, a first switch unit 204, a second switch unit 206, and a process unit 208.

The signal shaping unit 202 is electrically connected to the controller 100 for receiving the control signal transmitted from the controller 100, and shaping the control signal to generate a shaped control signal. The shaped control signal is transmitted to the first switch unit 204 correspondingly.

The first switch unit 204 is electrically connected to the signal shaping unit 202 for receiving the shaped control signal transmitted from the signal shaping unit 202. The first switch unit 204 is capable of being turned on and turned off according to different states of the shaped control signal, and outputting a first switching signal correspondingly. For example, when the shaped control signal is in a first state, e.g., a logical high level, the first switch unit 204 is turned on, and when the shaped control signal is at a second state, e.g., a logical low level, the first switch unit 204 is turned off.

The second switch unit 206 is electrically connected to the first switch unit 204 for receiving the first switching signal transmitted from the first switch unit 204. The second switch unit 206 is also electrically connected to the external power source 400 for receiving electrical power supplied from the external power source 400. The second switch unit 206 is capable of being turned on and turned off based on different states of the first switching signal transmitted from the first switch unit 204. For example, when the first switching signal is at a first state, e.g., a logical low level, the first switch unit 204 is turned on, and when the first switching signal is at a second state, e.g., a logical high level, the first switch unit 204 is turned off.

The second switch unit 206 is configured for opening, or closing, a transmission path for allowing the electrical power supplied from the external power source 400 to pass through, or not to pass through, based on the first state, or the second state, of the first switching signal correspondingly.

The process unit 208 is electrically connected to the second switch unit 206 for receiving electrical power transmitted from the second switch unit 206. The process unit 208 is configured for processing the electrical power to provide stable electrical power for charging the battery 300.

Figure 3:
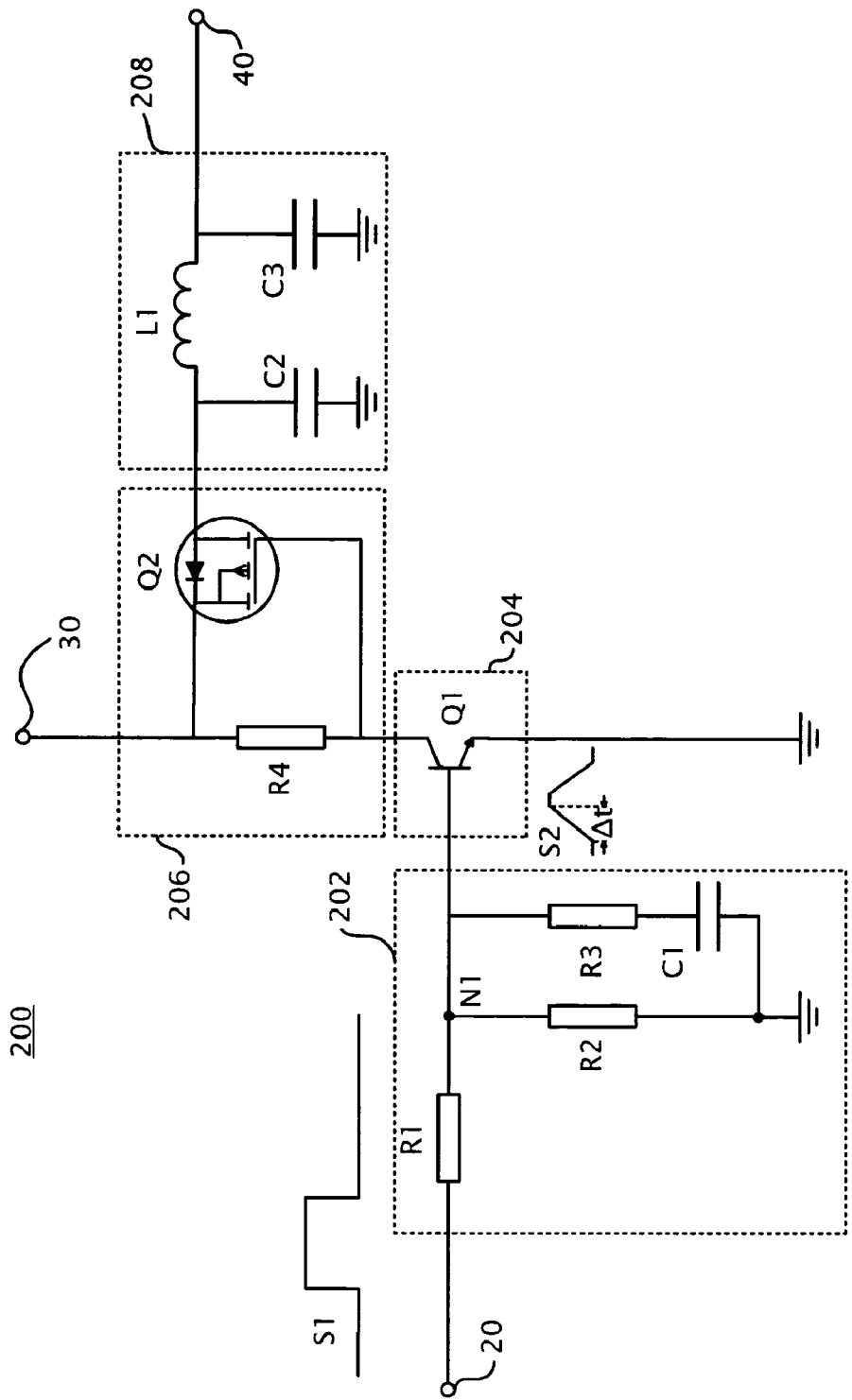
FIG. 3 is a schematic diagram of the charging control circuit in FIG. 1.

Referring to FIG. 3, a detailed circuit diagram of the charging control circuit 200 in accordance with an exemplary embodiment is illustrated. The charging control circuit 200 further includes a first input terminal 20, a second input terminal 30, and an output terminal 40. The first input terminal 20 is configured for receiving the control signal transmitted from the controller 100. The second input terminal 30 is configured for receiving the electrical power supplied from the external power source 400. The output terminal 40 is configured for outputting the stable electrical power to the battery 300.

The signal shaping circuit 202 includes a first resistor R1, a second resistor R2, a third resistor R3, and a capacitor C1. The first resistor R1 is electrically connected between the first input terminal 20 and a node N1. The first resistor R1 is configured for limiting a current flowing from the first input terminal 20 to the first switch unit 204. The second resistor R2 has one end connected to the node N1, and the other end grounded. The second resistor R2 is configured for providing a shunt path when the capacitor C1 is discharging. The third resistor R3 and the capacitor C1 are connected in series between the node N1 and ground. The third resistor R3 is configured for changing a time constant for charging the capacitor C1.

The first switch unit 204 includes a first transistor Q1. The first transistor Q1 may be a bipolar junction transistor (BJT) or a metal oxide semiconductor field effect transistor (MOSFET). In the exemplary embodiment, the transistor Q1 is a BJT. The first transistor Q1 has its base connected to the node N1, emitter grounded, and collector connected to the second input terminal 30 via the second switch unit 206. The base of the first transistor Q1 is configured for receiving the shaped control signal, and the collector of the first transistor Q1 is configured for outputting the first switching signal.

The second switch unit 206 includes a fourth resistor R4 and a second transistor Q2. The second transistor Q2 also may be a BJT or a MOSFET. In the exemplary embodiment, the second transistor Q2 is a p-channel depletion-mode MOSFET. The fourth resistor R4 is electrically connected between the second input terminal 30 and the collector of the first transistor Q1. The second resistor R4 is configured for biasing an appropriate voltage to the collector of the first transistor Q1. The second transistor Q2 has its drain connected to the second input terminal 30, its gate connected to the collector of the first transistor Q1, and its source connected to the process unit 208. The gate of the second transistor Q2 is configured for receiving the first switching signal outputted from the collector of the first transistor Q1.

The process unit 208 includes a first capacitor C2, a second capacitor C3, and an inductor L1. The inductor L1 has one end connected to the source of the second transistor Q2, the other end connected to the output terminal 40. The first capacitor C2 is connected between the one end of the inductor L1 and the ground. The second capacitor C2 is connected between the other end of the inductor L1 and the ground.

Hereinafter, an operation of the electronic device 10 employing the charging control circuit 200 will be described.

When the charging function of the electronic device 10 is enabled, the controller 100 transmits the control signal indicated as S1 (see FIG. 3) to the charging control circuit 200 via the first input terminal 20. At a first stage, the control signal S1 includes a first shape having a vertical rising edge from the first state (logical low level) to the second state (logical high level). An instantaneous current is generated and flows through the first resistor R1 and the third resistor R3 to charge the capacitor C1 at the second state (logical high level).

When the capacitor C1 charges, a voltage signal corresponds to a shaped control signal S2 at the node N1 increases gradually from a low voltage to a high voltage during a time interval $\Delta t$ (see FIG. 3). The shaped control signal S2 has a second shape with a slope rising edge from the low level to the high level. The shaped control signal S2 applies to the base of transistor Q1, causing the transistor Q1 to be turned on.

The collector of the transistor Q1 is dropped to ground when the transistor Q1 is turned on, causing a low level first switching signal to be outputted from the collector of the transistor Q1. The first switching signal in the low level applies to the gate of the second transistor Q2, and the second transistor Q2 becomes turned on. Thus, a transmission path is established for the electrical power supplied from the second input terminal 30 to flow through the second transistor Q2. The inductor L1, the first capacitor C2, and the second capacitor C3 of the process unit 208 receive the electrical power transmitted from the second transistor Q2, and filter the received electrical power to generate the stable electrical power. The stable electrical power is outputted from the output terminal 40 for charging the battery 300 accordingly.

At a second stage, the control signal S1 transmitted from the controller 100 changes from the high level to the low level. The capacitor C1 discharges via the second resistor R2 and the third resistor R3. As such, the shaped control signal S2 applied to the base of the first transistor Q1 decreases from the high voltage to the low voltage during substantially the same time interval $\Delta t$. The first transistor Q1 is turned off, and the first switching signal in the high level is applied to the gate of the second transistor Q2. The second transistor Q2 is turned off accordingly. As a result, the transmission path is cut off thereby inhibiting the flow of electrical power. Thus, the charging control circuit 200 cannot output electrical power to the battery 300 via the output terminal 40.

As described above, the control signal S1 transmitted from the controller 100 is shaped by the signal shaping unit 202 before being applied to the first switching unit 204. In the exemplary embodiment, the shaped control signal S2 has a sloping transition when going from the low voltage to the high voltage during the time interval $\Delta t$, such that the instantaneous current is prevented from being applied to the switching circuit 204. Accordingly, the first transistor Q1 is protected by the signal shaping unit 202.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A charging control circuit for providing electrical power from an external power source to a battery, the charging control circuit comprising:
    a signal shaping unit for receiving a control signal for enabling a charging function, the signal shaping unit shaping the received control signal and generating a shaped control signal, the shaped control signal transited from a first state to a second state during a time interval;
    a first switch unit connected to the signal shaping unit for receiving the shaped control signal, and generating a first switching signal based on the shaped control signal; and
    a second switch unit connected to the first switch unit for receiving the first switching signal, the second switch unit being turned on based on the first switching signal for allowing the electrical power to be outputted to the battery.

2. The charging control circuit of claim 1, wherein the signal shaping unit comprises:
    a first resistor and a capacitor connected in series between the first switch unit and ground.

3. The charging control circuit of claim 2, wherein the signal shaping unit further comprises:
   a second resistor connected between the first switch unit and ground.

4. The charging control circuit of claim 2, wherein the first switch unit comprises:
   a bipolar junction transistor (BJT), the BJT having its base connected to an end of the third resistor, and its emitter grounded.

5. The charging control circuit of claim 4, wherein the second switch unit comprises:
   a metal oxide semiconductor field effect transistor (MOSFET), the MOSFET having its gate connected to the collector of the BJT, its drain connected to the external power source, and its source coupled to the battery.

6. The charging control circuit of claim 2, further comprising a process unit, the process unit coupled between the second switch unit and the battery, the process unit configured for receiving electrical power supplied from the external power source, and processing the receiving electrical power to generate stable electrical power.

7. The charging control circuit of claim 6, wherein the process unit comprises:
   an inductor, a first capacitor, and a second capacitor, the inductor has one end connected to one end of the first capacitor, the other end connected to one end of the second capacitor, the other two ends of the first capacitor and the second capacitor are grounded.

8. A charging control circuit for providing electrical power from a power source to a battery, the charging control circuit comprising:
   a first input terminal for receiving a control signal, a second input terminal for receiving electrical power supplied from the power source, and an output terminal for outputting electrical power processed by the charging control circuit to the battery; and
   a capacitor, a first transistor and a second transistor, the capacitor electrically coupled between the first transistor and ground, the first transistor electrically connected to the second transistor, and the second transistor electrically coupled between the second input terminal and the output terminal;
   wherein the capacitor capable of receiving the control signal, and delaying the control signal at a predetermined time interval to be applied to the first transistor, the first transistor capable of controlling the second transistor to turn on based on the control signal delayed by the capacitor, such that the electrical power is allowed to be transferred from the second input terminal to the output terminal via the second transistor.

9. The charging control circuit of claim 8, further comprising:
   a first resistor, the first resistor has one end connected to the base of the first transistor, the other end connected to one end of the capacitor, and the other end of the capacitor is grounded.

10. The charging control circuit of claim 9, further comprising:
   a second resistor, the second resistor has one end connected to the base of the first transistor, and the other end of the second resistor is grounded.

11. The charging control circuit of claim 9, further comprising:
   a third resistor electrically connected between the first input terminal and the base of the first transistor.

12. The charging control circuit of claim 9, wherein the collector of the first transistor is connected to the gate of the second transistor.

13. The charging control circuit of claim 9, wherein the first transistor is a bipolar junction transistor, the second transistor is a metal oxide semiconductor field effect transistor.

14. An electronic device for charging a battery with electrical power supplied from an external power source, the electronic device comprising:
   a controller automatically generating a control signal for enabling a charging function of the electronic device; and
   a charging control circuit connected to the controller, the charging control circuit selectively providing a transmission path for transmitting the electrical power to the battery based on the control signal, the charging control circuit comprising a signal shaping unit for shaping the control signal having a first shape to yield a shaped control signal having a second shape;
   wherein the first shape of the control signal transited in a manner substantially vertically from a first state to a second state, the second shape of the shaped control signal transited in a manner substantially slope from a first state to a second state, such that the charging control circuit is protected by the signal shaping unit.

15. The electronic device of claim 14, wherein the signal shaping unit comprises:
   a first resistor and a capacitor, the first resistor and the capacitor coupled between the controller and ground.

16. The electronic device of claim 15, wherein the signal shaping unit further comprises:
   a second resistor connected in parallel to serially connected the first resistor and the capacitor.

17. The electronic device of claim 15, wherein the charging control circuit further comprises:
   a first switch unit connected to the signal shaping unit for receiving shaped control signal shaped by the signal shaping unit, and outputting a switching signal based on the shaped control signal; and
   a second switch unit connected to the first switch unit, the second switch unit is turned on by the switching signal transmitted from the first switch unit, and electrical power is transmitted from the external power source to the battery.

18. The electronic device of claim 17, wherein the first switch unit comprises a bipolar junction transistor (BJT), and the second switch unit comprises a metal oxide semiconductor field effect transistor (MOSFET), the base of the BJT is connected to one end of the first resistor, the emitter of the BJT is grounded, the collector of the BJT is connected to the gate of the MOSFET.

* * * * *